(12) United States Patent
Kurosawa et al.

(10) Patent No.: US 8,149,638 B2
(45) Date of Patent: Apr. 3, 2012

(54) SEMICONDUCTOR MEMORY DEVICE AND INSPECTING METHOD OF THE SAME

(75) Inventors: Tomonori Kurosawa, Yokohama (JP); Takahiko Sasaki, Tokyo (JP); Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/884,694

(22) Filed: Sep. 17, 2010

(65) Prior Publication Data
US 2011/0141794 A1 Jun. 16, 2011

(30) Foreign Application Priority Data
Dec. 10, 2009 (JP) ................. 2009-280608

(51) Int. Cl.
*G11C 7/00* (2006.01)
(52) U.S. Cl. ....................... 365/201; 365/148
(58) Field of Classification Search .............. 365/201, 365/148
See application file for complete search history.

(56) References Cited

U.S. PATENT DOCUMENTS

| 5,748,545 | A | * | 5/1998 | Lee et al. ............... 365/201 |
| 2004/0042331 | A1 | * | 3/2004 | Ikehashi et al. .......... 365/232 |
| 2007/0011508 | A1 | * | 1/2007 | Rong et al. .............. 714/718 |
| 2008/0291716 | A1 | | 11/2008 | Futatsuyama et al. |
| 2009/0046526 | A1 | * | 2/2009 | Lee et al. ............... 365/201 |
| 2009/0161461 | A1 | * | 6/2009 | Won ...................... 365/203 |

FOREIGN PATENT DOCUMENTS
JP 2008-205191 9/2008

OTHER PUBLICATIONS
U.S. Appl. No. 13/051,766, filed Mar. 18, 2011, Sasaki.
U.S. Appl. No. 12/861,309, filed Aug. 23, 2010, Kazushige Kanda.

* cited by examiner

*Primary Examiner* — Huan Hoang
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a semiconductor memory device includes a memory cell array includes memory cells, lines provided to correspond to the memory cells, a first decoder configured to select a first line as an inspection target from the lines, a second decoder configured to select a second line for generating a reference voltage from the lines, a driver configured to charge the first and second lines, a discharging circuit configured to simultaneously discharge the first and second lines, and a sense amplifier configured to compare a voltage of the first line with a voltage of the second line to detect a defect of the first line while the first line is discharged.

18 Claims, 14 Drawing Sheets

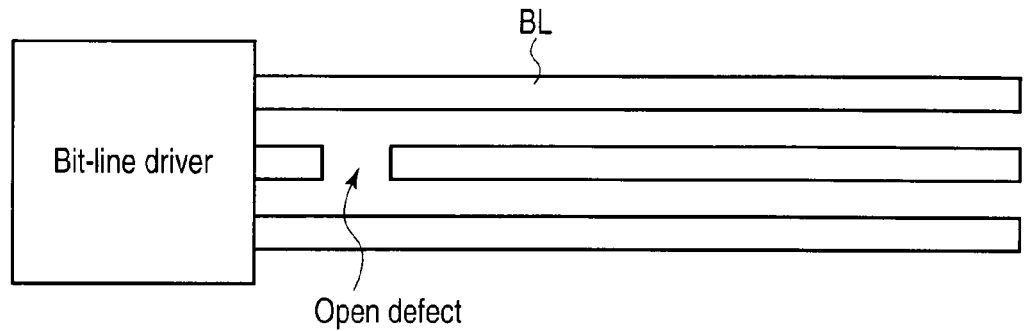
F I G. 1
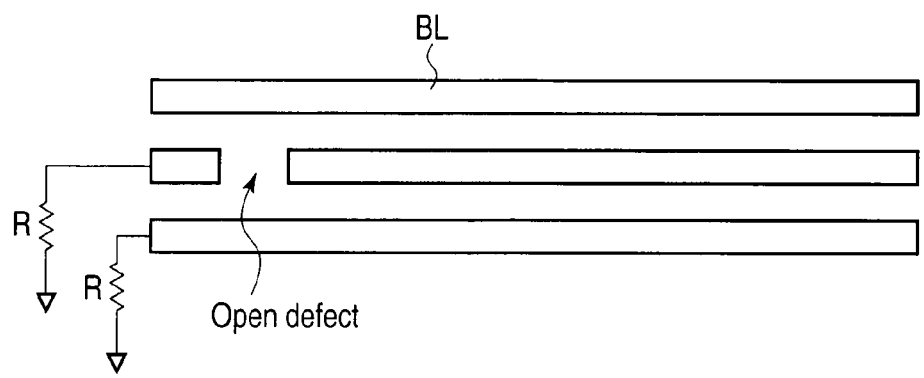
F I G. 2

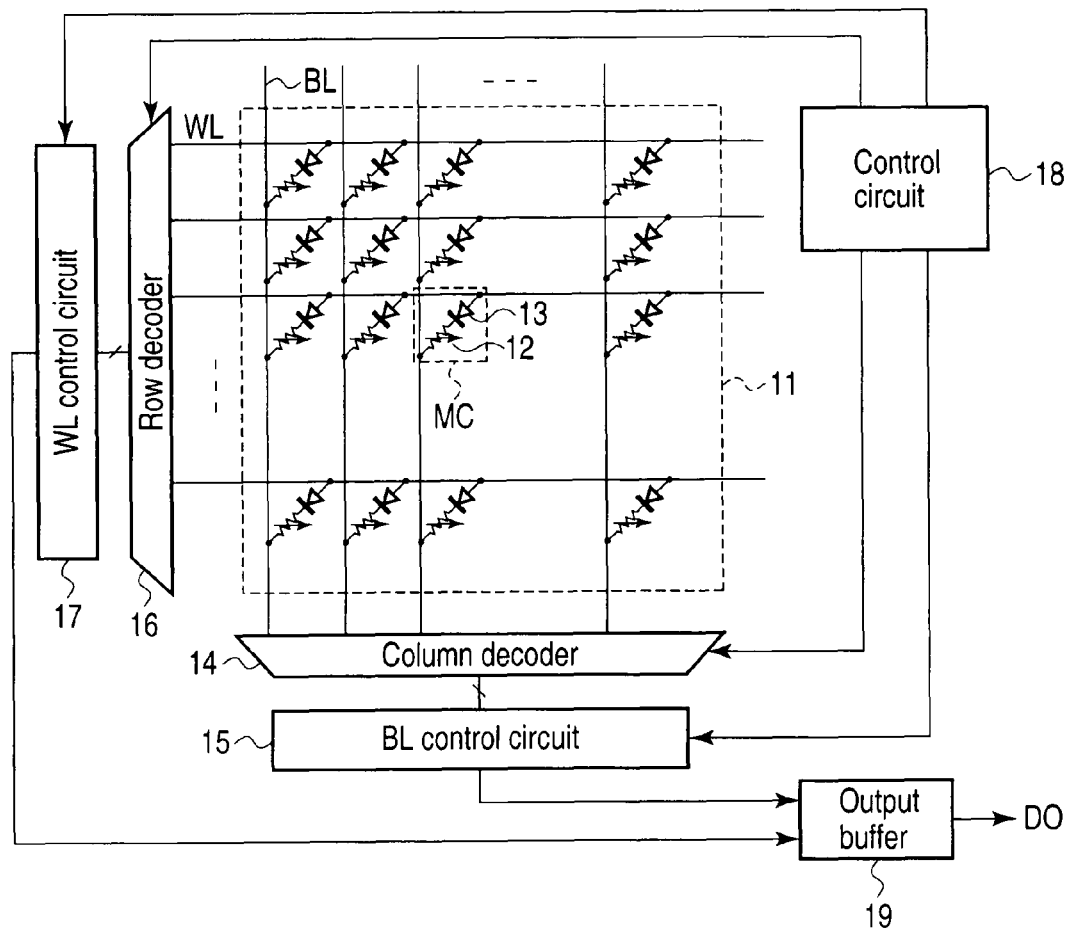
F I G. 3

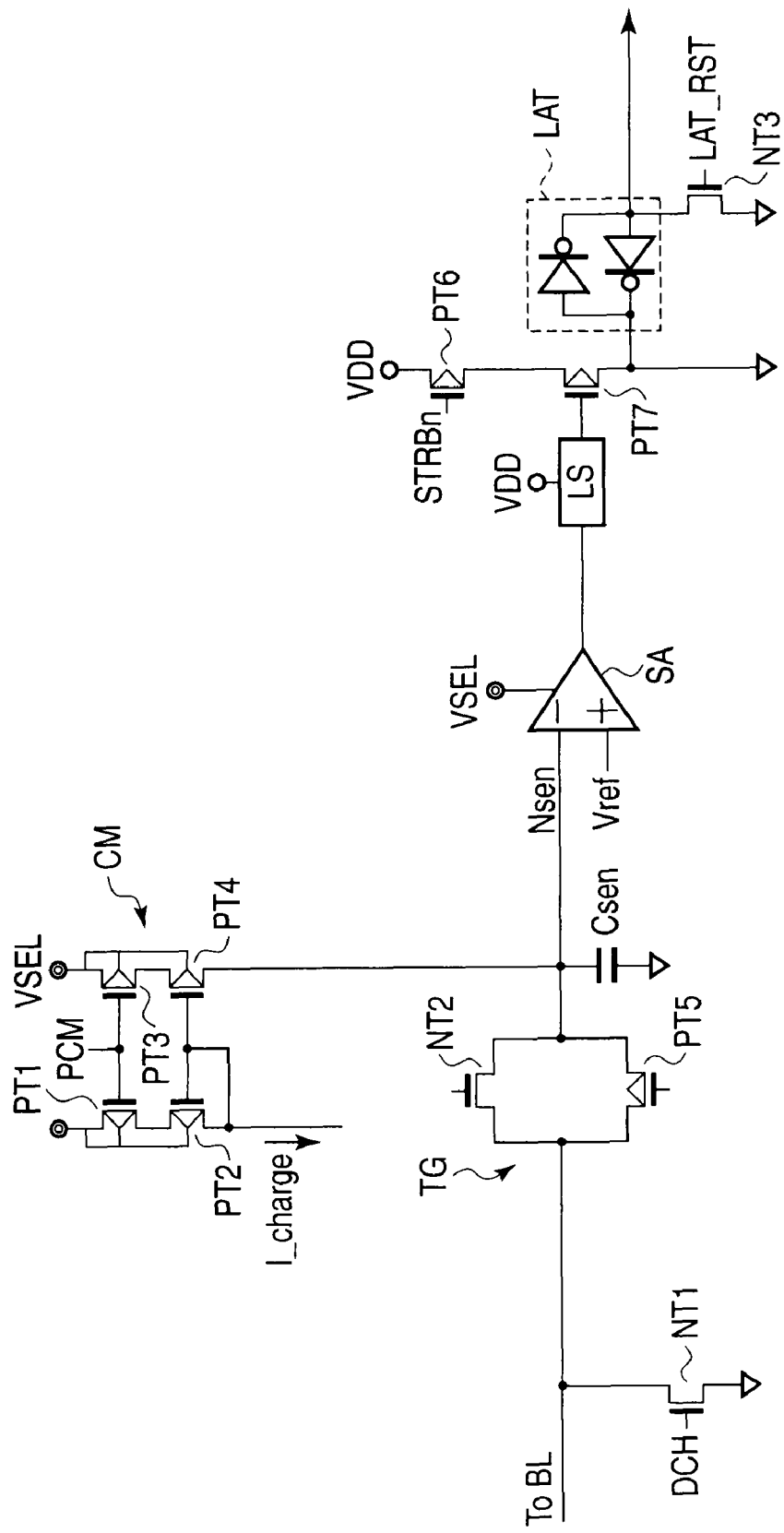
F I G. 6

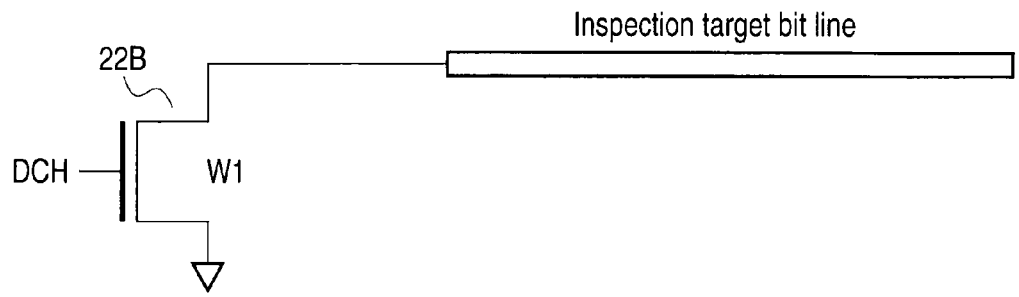
F I G. 1 2 A
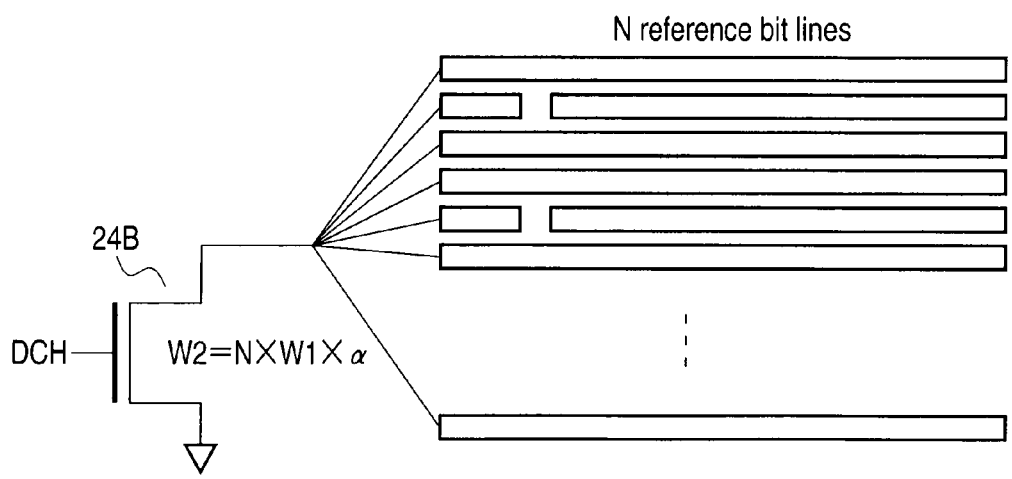
F I G. 1 2 B

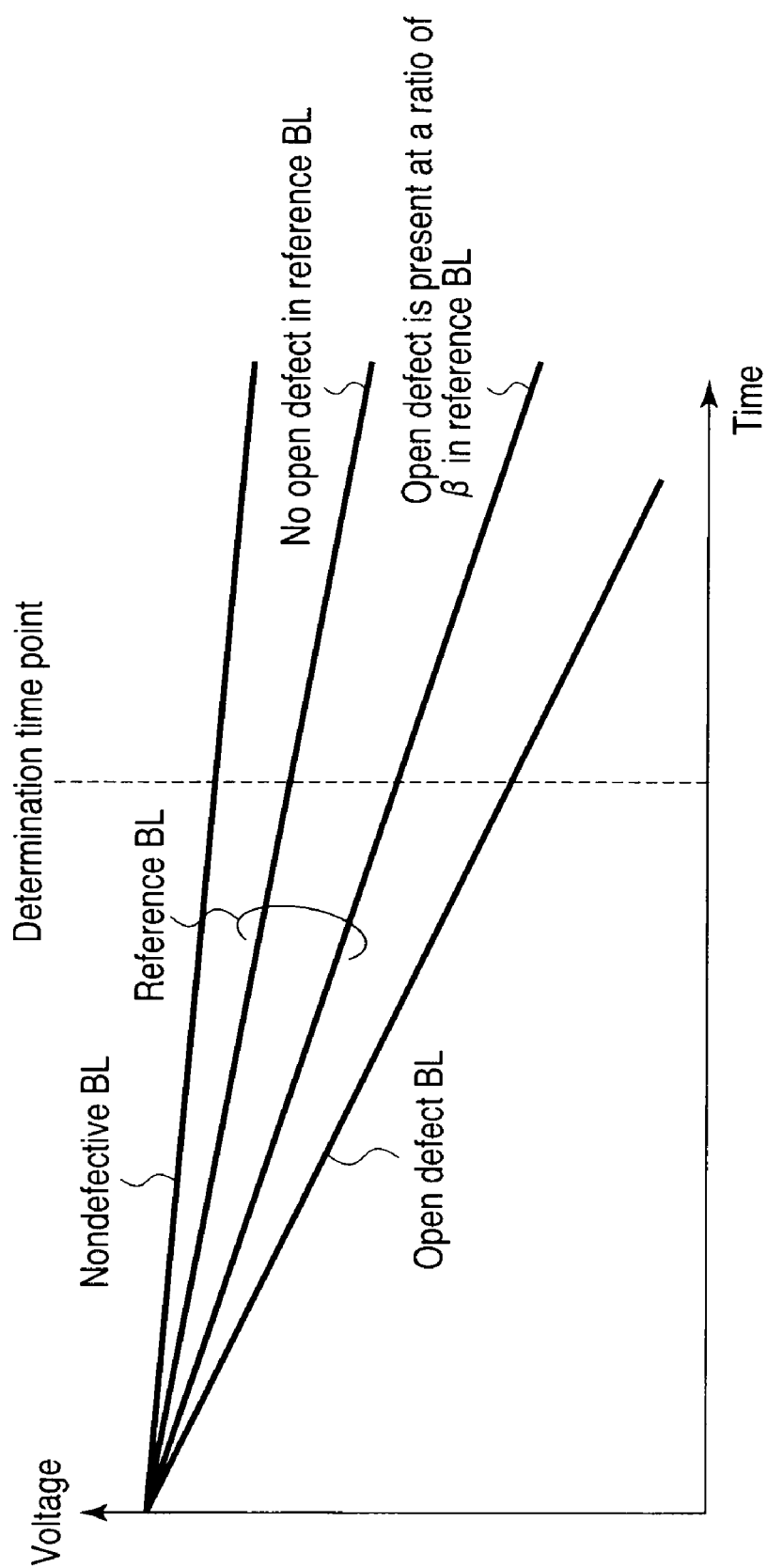
F I G. 13

SEMICONDUCTOR MEMORY DEVICE AND INSPECTING METHOD OF THE SAME

CROSS-REFERENCE TO RELATED APPLICATIONS

This application is based upon and claims the benefit of priority from Japanese Patent Application No. 2009-280608, filed Dec. 10, 2009; the entire contents of which are incorporated herein by reference.

FIELD

Embodiments described herein relate generally to a semiconductor memory device and an inspecting method of the same.

BACKGROUND

A cross-point memory has been known in which memory cells are arranged in intersection regions of bit lines and word lines. When an open defect of a line is detected in the cross-point memory, the open defect can be detected only by allowing a current to flow through the bit line and the word line via the memory cell. That is, it is necessary to access the memory cells in a stage in which the open defect of the bit lines is inspected.

For example, two problems to be feared are present in this inspecting method. The first problem is that when any current does not flow through the bit line and the word line, it cannot be detected where a defective portion exists in the memory cell, the word line and the bit line. The second problem is that an unnecessary stress might be applied to the memory cells in the inspection stage.

Moreover, there is disclosed a semiconductor memory which requires a process of applying a voltage to the memory cells having an insulating state to activate the memory cells, i.e., a so-called forming process (e.g., Jpn. Pat. Appln. KOKAI Publication No. 2008-205191). In this semiconductor memory, when the forming process is also performed with respect to memory cells connected to defective lines, much time may be required for the forming process of the whole semiconductor memory.

BRIEF DESCRIPTION OF THE DRAWINGS

FIG. 1 is a diagram for explaining a technique for detecting the open defect of a line;

FIG. 2 is a diagram for explaining the technique for detecting the open defect of the line;

FIG. 3 is a block diagram showing a constitution of a resistance-change memory 10 according to a first embodiment;

FIG. 6 is a circuit diagram showing a constitution of a BL control circuit 15;

FIGS. 12A and 12B are diagrams for explaining conditions of an NMOSFET for discharging;

FIG. 13 is a graph showing discharging characteristics of an inspection target bit line and a reference bit line;

DETAILED DESCRIPTION

Figure 4:
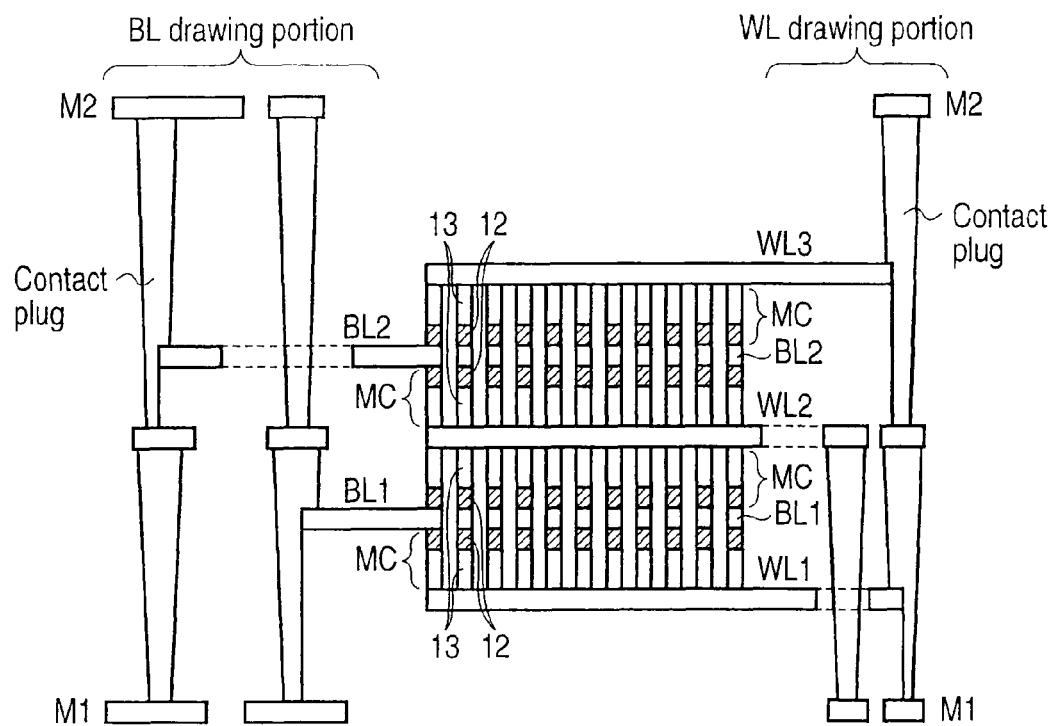
FIG. 4 is a schematic diagram showing a constitution of a memory cell array 11.

In general, according to one embodiment, there is provided a semiconductor memory device comprising:

a memory cell array comprising memory cells;

lines provided to correspond to the memory cells;

a first decoder configured to select a first line as an inspection target from the lines;

a second decoder configured to select a second line for generating a reference voltage from the lines;

a driver configured to charge the first and second lines;

a discharging circuit configured to simultaneously discharge the first and second lines; and a sense amplifier configured to compare a voltage of the first line to a voltage of the second line to detect a defect of the first line while the first line is discharged.

The embodiments will be described hereinafter with reference to the accompanying drawings. In the description which follows, the same or functionally equivalent elements are denoted by the same reference numerals, to thereby simplify the description.

Outline of the Present Embodiment

First, a technique for detecting the open defect of a line is described. As shown in FIG. 1, a plurality of lines, for example, bit lines BL are arranged to extend in the same direction, and the plurality of bit lines BL are connected to a bit-line driver. The plurality of bit lines BL include bit lines in which an open defect is generated and bit lines in which any open defect is not generated (nondefective bit lines). It is to be noted that the open defect is a state where one line is electrically cut halfway or a state where the end of one line is electrically cut from a contact or a circuit to be connected to the line.

The capacitance of the bit line having the open defect is different from that of the nondefective bit line. Specifically, the capacitance of the bit line having the open defect has a capacitance smaller than that of the nondefective bit line, because the length of the bit line having the open defect is different from that of the nondefective bit line. When the bit lines having different capacitances are charged and then discharged, a time required for the discharging of the bit line becomes different from that of the other bit line. Therefore, the open defect of the line can be detected by utilizing this discharge time difference.

First, as shown in FIG. 1, the bit-line driver is used to charge the bit lines up to an equal predetermined voltage. Subsequently, as shown in FIG. 2, the charged bit lines are grounded via resistors R (e.g., transistors). Then, the bit line having a larger capacitance requires a longer discharge time, whereas the bit line having a smaller capacitance requires a shorter discharge time. Therefore, it can be determined whether the open defect is generated in the bit line as an inspection target, by comparing the voltage of the bit line with a predetermined reference voltage after the elapse of a predetermined time from the start of the discharging.

Hereinafter, a specific embodiment for detecting the open defect of a line used in a semiconductor memory device will be described.

First Embodiment

A semiconductor memory device of the present embodiment is a resistance-change memory comprising memory cells each having a resistance which changes in accordance with, for example, stored data. As this resistance-change memory, it is possible to use any one of various types of memories such as a resistive random access memory (ReRAM), a magnetic random access memory (MRAM) and a phase-change random access memory (PCRAM). In the present embodiment, the ReRAM will be described as one example of the resistance-change memory.

FIG. 3 is a block diagram showing a constitution of a resistance-change memory 10 according to the first embodiment. In a memory cell array 11, there are arranged a plurality of word lines WL extending in a row direction, respectively, and a plurality of bit lines BL extending in a column direction, respectively. Memory cells MC are arranged in intersection regions of the word lines WL and the bit lines BL. That is, the resistance-change memory 10 of the present embodiment is a cross-point resistance-change memory.

Each of the memory cells MC comprises a variable resistance element 12 and a selection element 13 which are connected in series. For example, a diode is used as the selection element 13. One end of the variable resistance element 12 is connected to the bit line BL. The other end of the variable resistance element 12 is connected to a cathode of the diode 13. An anode of the diode 13 is connected to the word line WL. The connecting relation of the diode 13 is appropriately set in accordance with a peripheral circuit constitution of the resistance-change memory or a constitution of a resistance-change film included in the variable resistance element 12.

The memory cell array 11 of the present embodiment has a three-dimensional structure in which a plurality of layers of two-dimensionally arranged memory cell arrays are laminated. FIG. 4 is a schematic diagram showing the constitution of the memory cell array 11.

A first level wiring layer includes a plurality of word lines WL1 extending in the row direction, respectively. A second level wiring layer includes a plurality of bit lines BL1 extending in a column direction, respectively. The memory cell MC including the diode 13 and the variable resistance element 12 laminated in this order is disposed between each of the word lines WL1 and each of the bit lines BL1. A third level wiring layer includes a plurality of word lines WL2 extending in the row direction, respectively. The memory cell MC including the variable resistance element 12 and the diode 13 laminated in this order is disposed between each of the bit lines BL1 and each of the word lines WL2. While holding this relation, the bit lines BL, the word lines WL and the memory cells MC are laminated to constitute the memory cell array 11. FIG. 4 shows a structure in which four layers of memory cells are laminated as one example, but there is not any special restriction on the number of laminated layers.

The word lines WL1 to WL3 are electrically connected to a WL drawing portion. The WL drawing portion is constituted of a plurality of levels of lines (M1 and M2) and contact plugs which connect these layers to each other. The word lines WL1 to WL3 are connected to a row decoder via the WL drawing portion.

The bit lines BL1 and BL2 are electrically connected to a BL drawing portion. The BL drawing portion is constituted of a plurality of levels of lines (M1 and M2) and contact plugs which connect these layers to each other. The bit lines BL1 and BL2 are connected to a column decoder via the BL drawing portion. It is to be noted that, in FIG. 4, the bit lines BL extend in a direction into or out of the sheet surface, and hence the BL drawing portion is projected in the row direction as shown.

Figure 5:
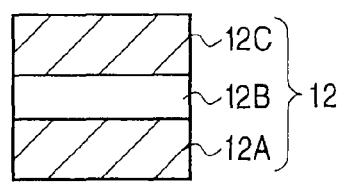
FIG. 5 is a sectional view showing a constitution of a variable resistance element 12.

FIG. 5 is a sectional view showing a constitution of the variable resistance element 12. The variable resistance element 12 has a constitution in which a lower electrode 12A, a resistance-change film 12B and an upper electrode 12C are laminated in this order. As the resistance-change film 12B, for example, a transition metal oxide is used, and specific examples thereof include $NiO_X$, $CoO_X$ and $TiO_X$.

When a voltage or a current is supplied to the variable resistance element 12, the element can take at least two resistances as a bistable state at room temperature. These two stable resistances are written and read, whereby a memory operation of at least two values can be realized. When the variable resistance element 12 performs the binary memory operation, for example, the low-resistance state of the variable resistance element 12 is associated with binary 1, and the high-resistance state thereof is associated with binary 0.

To activate the variable resistance element 12 (i.e., set the element to the initial state of a memory element), an operation referred to as forming is necessary. Forming means that a slightly high constant voltage is applied to the resistance-change film 12B made of a metal oxide by use of the upper electrode 12C and the lower electrode 12A, and the forming is a first operation performed so that the memory cells can be utilized as resistance-change memories. Before performing the forming, the resistance-change film 12B has an insulated state, and any current does not flow therethrough. By performing the forming, for example, a current path (filament) is formed in the resistance-change film 12B. Moreover, when the resistance-change film 12B has the low-resistance state, the current flows from the lower electrode 12A to the upper electrode 12C through this filament.

In FIG. 3, the plurality of bit lines BL are connected to a column decoder 14. The column decoder 14 selects any one line from the plurality of bit lines BL based on, for example, an address sent from a control circuit 18.

A BL control circuit 15 starts the discharging of the bit lines BL, and after the elapse of a predetermined discharge time, the circuit outputs the result of comparison between the voltage of the bit line BL and a reference voltage Vref. To realize this function, the BL control circuit 15 comprises a bit-line driver which charges the bit lines BL, a discharging circuit which discharges the bit lines BL, a sense amplifier SA which detects the voltage of the bit lines BL, a latch circuit (determination circuit) LAT which holds the output of the sense amplifier SA, and the like. The output from the BL control circuit 15 is output to the outside through an output buffer 19 as data D0. In addition, the BL control circuit 15 also has a function of performing a data writing operation and a data reading operation.

The plurality of word lines WL are connected to a row decoder 16. The row decoder 16 selects any one line from the plurality of word lines WL based on, for example, an address sent from the control circuit 18.

A WL control circuit 17 starts the discharging of the word lines WL, and after the elapse of the predetermined discharge time, the circuit outputs the result of comparison between the voltage of the word line WL and the reference voltage Vref. To realize this function, the WL control circuit 17 comprises a word-line driver which charges the word lines WL, a discharging circuit which discharges the word lines WL, a sense amplifier SA which detects the voltage of the word line WL, a latch circuit (determination circuit) LAT which holds the output of the sense amplifier SA, and the like. The output from the WL control circuit 17 is output to the outside through the output buffer 19 as data D0.

The control circuit 18 controls the operation of the whole resistance-change memory 10. Specifically, the control circuit 18 sends the addresses or control signals to the column decoder 14, the BL control circuit 15, the row decoder 16 and the WL control circuit 17 to control these circuits.

Next, one example of a specific constitution of the BL control circuit 15 will be described. FIG. 6 is a circuit diagram showing the constitution of the BL control circuit 15. It is to be noted that various types of control signals input to the BL control circuit 15 are supplied from the control circuit 18.

A sense node Nsen is connected to a current mirror circuit CM. The current mirror circuit CM functions as the bit-line driver which charges the bit lines. The current mirror circuit CM comprises four P-channel metal semiconductor field effect transistors (MOSFETs) PT1 to PT4.

The source of PMOSFET PT1 is connected to a power source VSEL, and a signal PCM which controls the activation/inactivation of the current mirror circuit CM is input to the gate of PMOSFET PT1. The drain of PMOSFET PT2 is connected to the source of PMOSFET PT1, the gate of PMOSFET PT2 is connected to the drain thereof, and the drain of PMOSFET PT2 is connected to a current source (not shown) through which a current I_charge flows. The source of PMOSFET PT3 is connected to the power source VSEL, and signal PCM is input to the gate of PMOSFET PT3. The drain of PMOSFET PT4 is connected to the source of PMOSFET PT3, the gate of PMOSFET PT4 is connected to the gate of PMOSFET PT2, and the drain of PMOSFET PT4 is connected to the sense node Nsen.

The bit-line driver (current mirror circuit CM) having such a constitution is activated when signal PCM is low, to supply the current I_charge to the sense node Nsen.

One electrode of a capacitor Csen is connected to the sense node Nsen, and the other electrode of the capacitor Csen is grounded. The sense node Nsen is connected to the bit line BL via a transfer gate TG. The transfer gate TG turns on when the bit line is charged and when the bit line is discharged. The transfer gate TG has, for example, a constitution in which an N-channel MOSFET NT2 and a PMOSFET PT5 are connected in parallel.

The drain of an NMOSFET NT1 as a discharging circuit is connected to the bit line BL, a signal DCH which controls the timing to discharge the bit line BL is input to the gate of NMOSFET NT1, and the source of NMOSFET NT1 is grounded. Signal DCH is high when the bit line BL is discharged.

An inverting input terminal of the sense amplifier SA is connected to the sense node Nsen, and a reference voltage Vref is applied to a non-inverting input terminal of the sense amplifier SA. The reference voltage Vref is used to determine whether an open defect is generated in the bit line as an inspection target or whether the bit line as the inspection target is nondefective. During the determination, the voltage is set to a voltage which can sort both the bit lines, i.e., a voltage between the voltage of the bit line having the open defect and the voltage of the nondefective bit line (both the voltages are not included). The sense amplifier SA detects the difference between the voltage of the sense node Nsen and the reference voltage Vref.

The source of a PMOSFET PT6 is connected to a power source VDD for a logic circuit, a signal STRBn which controls the timing to determine the voltage of the bit line as the inspection target is input to the gate of PMOSFET PT6, and the drain of PMOSFET PT6 is connected to the drain of a PMOSFET PT7.

An output terminal of the sense amplifier SA is connected to the gate of PMOSFET PT7 via a level shifter LS. The source of PMOSFET PT7 is grounded, and is connected to an input terminal of a latch circuit LAT. The latch circuit LAT is constituted of, for example, two clocked inverters, and the output of one of the clocked inverters is connected to the input of the other clocked inverter.

An output terminal of the latch circuit LAT is connected to the output buffer 19. Moreover, the output terminal of the latch circuit LAT is connected to the drain of an NMOSFET NT3 for resetting the data of the latch circuit LAT. A signal LAT_RST which controls the timing to reset the data of the latch circuit LAT is input to the gate of NMOSFET NT3, and the source of NMOSFET NT3 is grounded. Signal LAT_RST is high when the data of the latch circuit LAT is reset.

(Operation)

Figure 7:
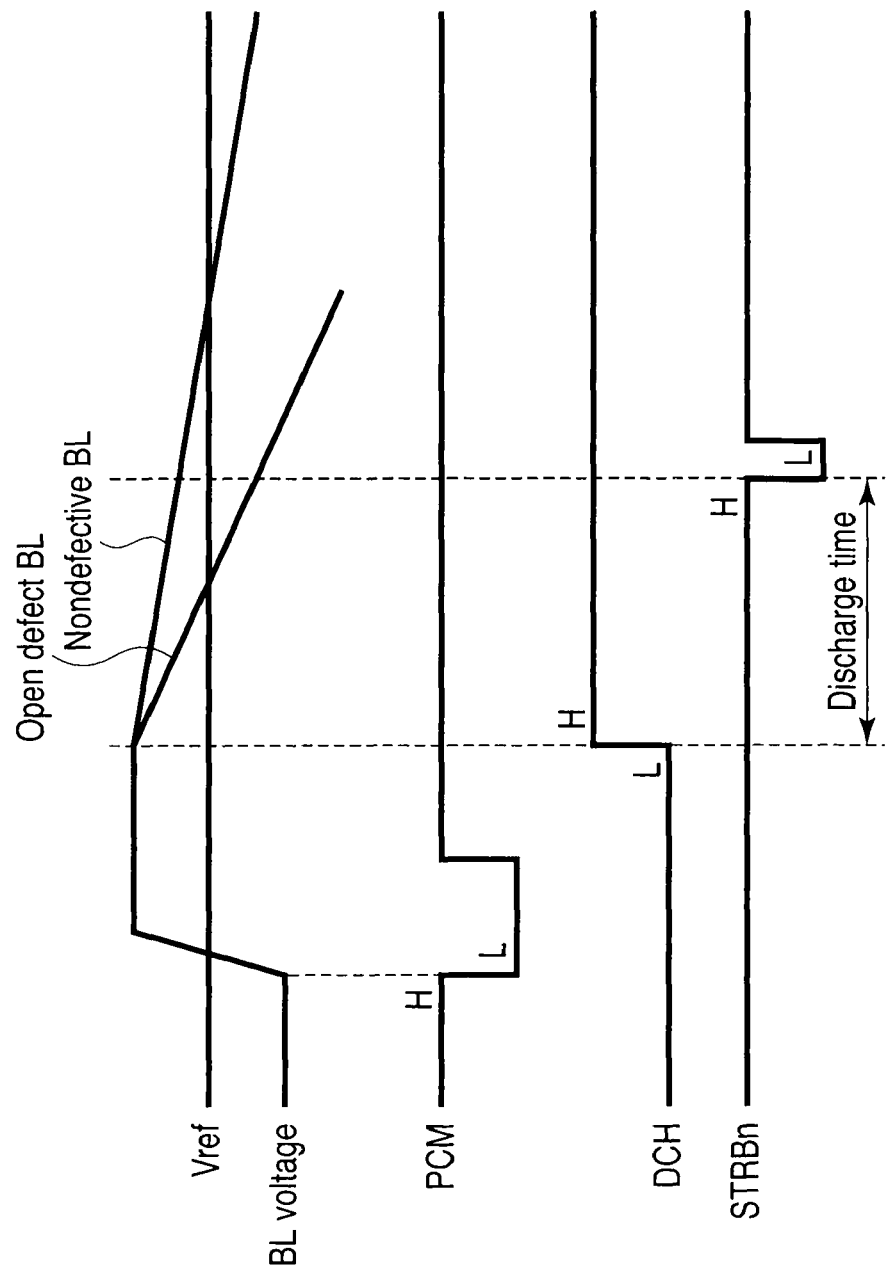
FIG. 7 is a timing chart for explaining an operation of detecting the open defect of a bit line BL.

Next, an operation of the resistance-change memory 10 having such a constitution will be described. FIG. 7 is a timing chart for explaining the operation of detecting the open defect of the bit line BL.

First, the column decoder 14 selects the bit line BL as the inspection target. Subsequently, the transfer gate TG turns on, and the bit line BL is connected to the sense node Nsen. Subsequently, signal PCM goes low, and the current mirror circuit CM is activated. Consequently, the current mirror circuit CM starts the charging of the bit line BL. After the bit line BL is charged with a predetermined potential, signal PCM goes high, and the current mirror circuit CM is inactivated.

Subsequently, signal DCH goes high, and NMOSFET NT1 turns on. Consequently, the discharging of the bit line BL is started via NMOSFET NT1. Here, the capacitance of the bit line having the open defect is different from that of the nondefective bit line. Specifically, the capacitance of the bit line having the open defect is smaller than that of the nondefective bit line. Therefore, as shown in FIG. 7, the voltage of the nondefective bit line gently lowers, whereas the voltage of the bit line having the open defect has a larger lowering ratio as compared to the nondefective bit line.

The sense amplifier SA detects the difference between the voltage of the sense node Nsen, i.e., the voltage of the bit line BL and the reference voltage Vref. Subsequently, after the elapse of a predetermined discharge time, signal STRBn goes low, and PMOSFET PT6 turns on. At this time, when the output of the sense amplifier SA is positive, i.e., the voltage of the bit line BL is lower than the reference voltage Vref, binary 1 is held by the latch circuit LAT. On the other hand, when the output of the sense amplifier SA is negative, i.e., the voltage of the bit line BL is higher than the reference voltage Vref, binary 0 is held by the latch circuit LAT. Consequently, it can be determined by the data output from the latch circuit LAT whether the bit line BL as the inspection target has the open defect or is nondefective.

It is to be noted that there is a high probability that the open defect of the bit line BL is generated in the BL drawing portion of FIG. 4, i.e., the drawing-around portion of the bit line BL or the connected portion of the bit line to the contact plug owing to a device structure. Therefore, the difference between the capacitance of the bit line having the open defect and the capacitance of the nondefective bit line increases. Consequently, the difference in discharge time between both bit lines also increases, and hence it is possible to determine whether the bit line BL has an open defect or is nondefective. This also applies to the word line WL.

An operation of detecting the open defect of the word line WL is the same as that in the case of the bit line BL. That is, the row decoder 16 and the WL control circuit 17 execute the same operations as those of the column decoder 14 and the BL control circuit 15, respectively. Moreover, the constitution of the WL control circuit 17 is the same as that of the BL control circuit 15 shown in FIG. 6 except that the bit line BL changes to the word line WL.

Figure 8:
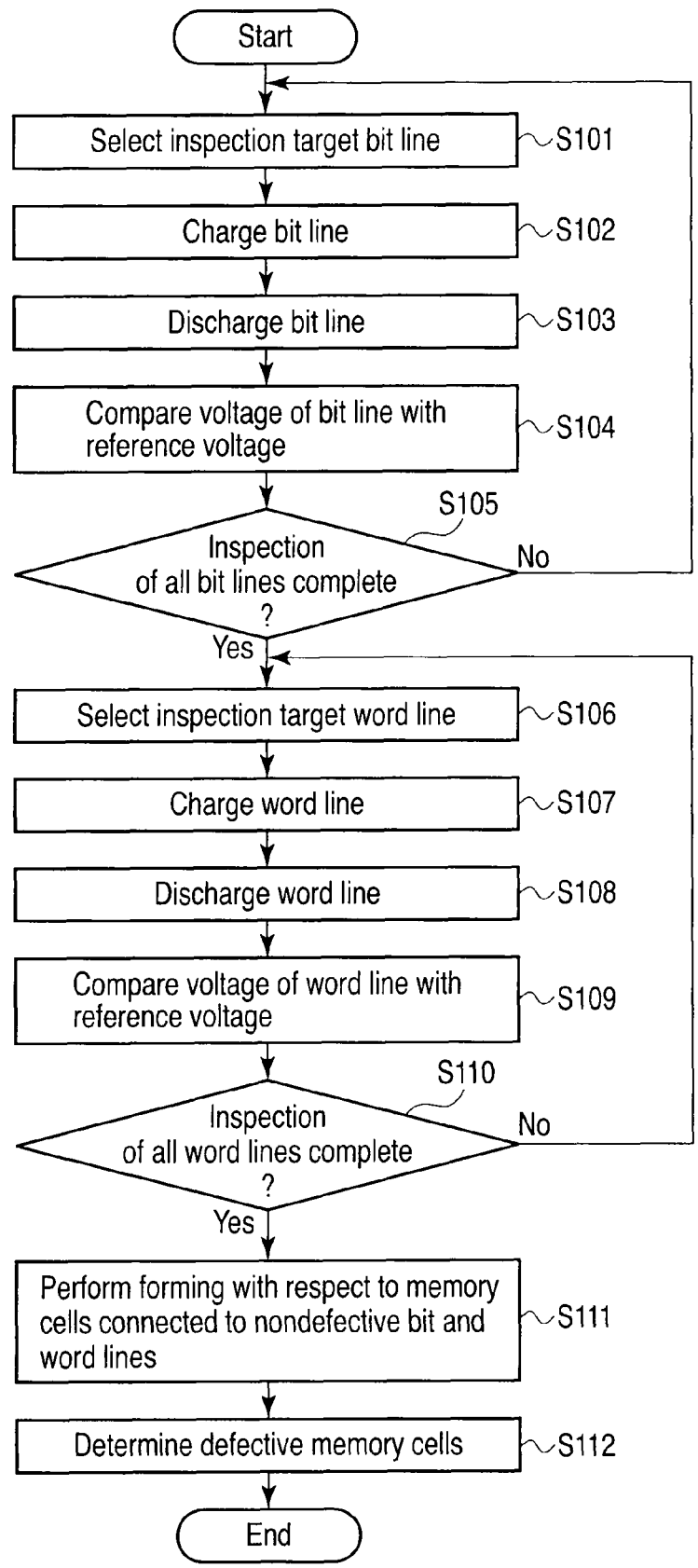
FIG. 8 is a flowchart showing an inspecting method of the resistance-change memory 10.

Next, an inspecting method of the resistance-change memory 10 will be described. FIG. 8 is a flowchart showing the inspecting method of the resistance-change memory 10.

First, the column decoder 14 selects the bit line as the inspection target (step S101). Subsequently, the BL control circuit 15 charges the bit line as the inspection target with a predetermined voltage (step S102). Subsequently, the BL control circuit 15 discharges the bit line as the inspection target (step S103). Subsequently, after the elapse of a predetermined time from the start of the discharging, the BL control circuit 15 compares the voltage of the bit line as the inspection target to the reference voltage Vref (step S104). Subsequently, the process of steps S101 to S104 is performed with respect to all the bit lines (step S105).

Subsequently, the row decoder 16 selects the word line as the inspection target (step S106). Subsequently, the WL control circuit 17 charges the word line as the inspection target with a predetermined voltage (step S107). Subsequently, the WL control circuit 17 discharges the word line as the inspection target (step S108). Subsequently, after the elapse of a predetermined time from the start of the discharging, the WL control circuit 17 compares the voltage of the word line as the inspection target to the reference voltage Vref (step S109). Subsequently, the process of steps S106 to S109 is performed with respect to all the word lines (step S110).

At this time, the sorting of a line having the open defect and a nondefective line has been finished. Therefore, a forming process is performed only with respect to the memory cell connected to the nondefective bit and word lines (step S111). That is, the bit and word lines are used to apply a slightly high constant voltage to the memory cell MC (specifically, the resistance-change film 12B). Consequently, the resistance-change film 12B has an insulated state before the forming process, but after the forming process, the resistance-change film 12B changes to a film which switches to the low- or high-resistance state in accordance with an applied voltage or a supplied current. This forming process is performed with respect to all the memory cells MC connected to the nondefective bit and word lines.

Subsequently, the currents of the memory cells where the forming process has ended are measured to determine defective memory cells (step S112). This determination is also performed only with respect to the memory cells connected to the nondefective bit and word lines.

(Effect)

As described above in detail, in the first embodiment, the plurality of lines (bit and word lines) connected to the plurality of memory cells are inspected to determine whether the open defect is generated, before the forming process of the memory cells. That is, after charging the line as the inspection target, this line is discharged. The discharge time of the bit line having the open defect is different from that of the nondefective bit line owing to the difference between the capacitances of these bit lines. Therefore, after the elapse of the predetermined time from the start of the discharging, the voltage of the bit line as the inspection target is compared to the reference voltage for sorting the nondefective bit lines and the bit lines having the open defect, to determine whether the bit line as the inspection target has the open defect. Afterward, the forming process is performed only with respect to the memory cells connected to the nondefective lines.

Therefore, according to the first embodiment, any current does not flow through the memory cells, but the open defect of the lines can be detected. Consequently, the defect of the lines and the defect of the memory cells can be sorted. Consequently, the subsequent inspection process can be performed without any waste, and hence manufacturing costs can be decreased.

Moreover, the nondefective bit and word lines are sorted before the forming process. Furthermore, the forming process is performed only with respect to memory cells MC connected to the nondefective bit and word lines. Consequently, a time required for the forming process can noticeably be shortened. This can noticeably decrease the manufacturing costs.

Second Embodiment

In a second embodiment, a predetermined number of reference bit lines are selected from a plurality of bit lines BL, and these reference bit lines are charged and discharged to generate a reference voltage Vref. Moreover, the generated reference voltage Vref is compared to the voltage of an inspection target bit line to determine whether an open defect is present in the inspection target bit line.

Figure 9:
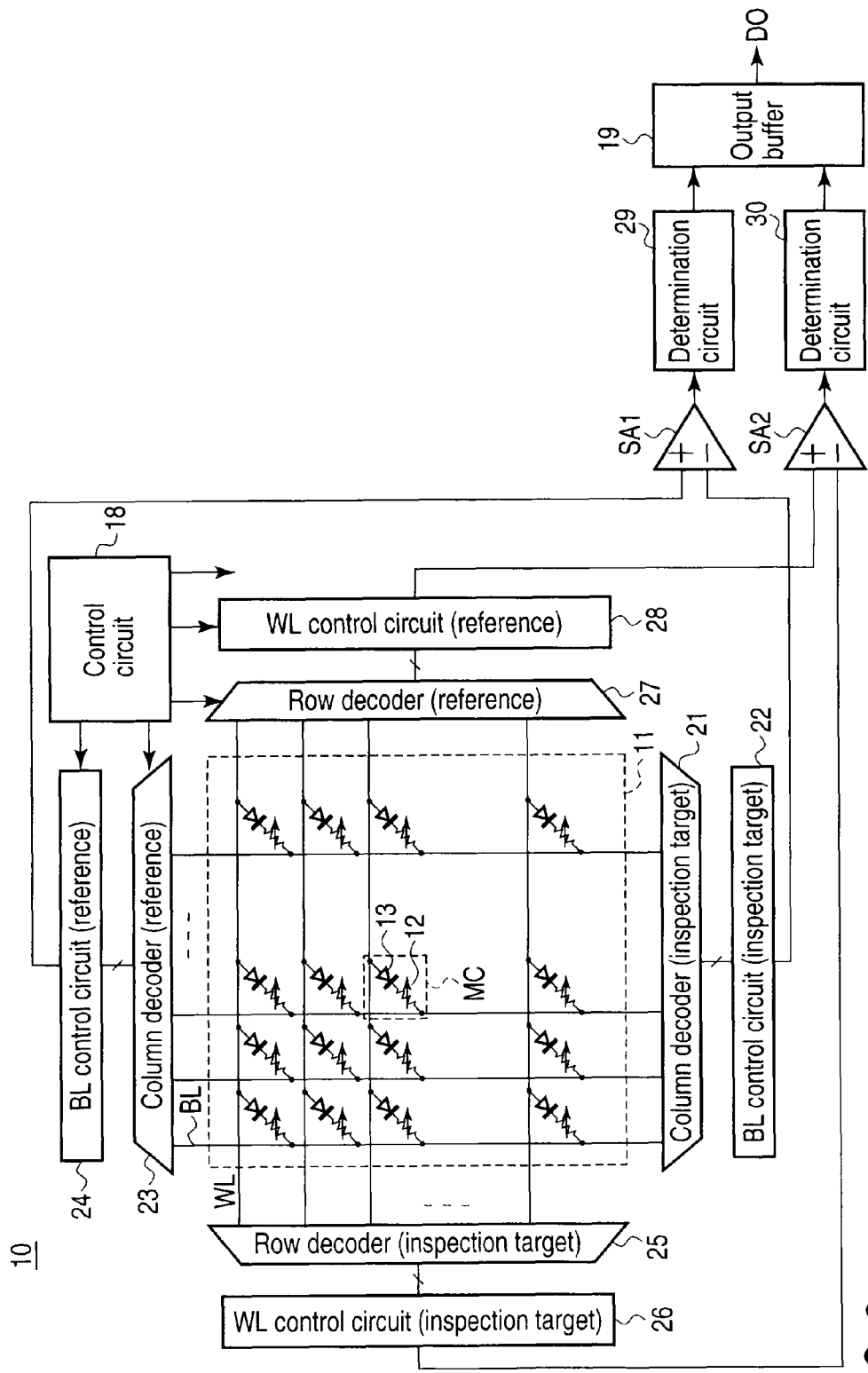
FIG. 9 is a block diagram showing a constitution of a resistance-change memory 10 according to a second embodiment.

FIG. 9 is a block diagram showing a constitution of a resistance-change memory 10 according to the second embodiment.

One end of each of a plurality of bit lines BL is connected to a column decoder 21 for the inspection target bit line. The column decoder 21 selects one inspection target bit line from the plurality of bit lines BL based on, for example, an address sent from a control circuit 18.

A BL control circuit 22 for the inspection target bit line performs the charging and discharging of the inspection target bit line. To realize this function, the BL control circuit 22 comprises a bit-line driver which charges the bit line and a discharging circuit which discharges the bit line.

The other end of each bit line BL is connected to a column decoder 23 for a reference bit line. The column decoder 23 selects N (N is an integer of 1 or more) reference bit lines from the plurality of bit lines BL based on, for example, an address sent from the control circuit 18. It is to be noted that the number of the reference bit lines may be one, but is preferably 2 or more.

A BL control circuit 24 for the reference bit line performs the charging and discharging of the reference bit line. To realize this function, the BL control circuit 24 comprises a bit-line driver which charges the reference bit line and a discharging circuit which discharges the bit line.

One end of each of a plurality of word lines WL is connected to a row decoder 25 for an inspection target word line. The row decoder 25 selects one inspection target word line from the plurality of word lines WL based on, for example, an address sent from the control circuit 18.

A WL control circuit 26 for the inspection target word line performs the charging and discharging of the inspection target word line. To realize this function, the WL control circuit 26 comprises a word-line driver which charges the word line and a discharging circuit which discharges the word line WL.

The other end of each word line WL is connected to a row decoder 27 for a reference word line. The row decoder 27 selects N (N is an integer of 1 or more) reference word lines from the plurality of word lines WL based on, for example, an address sent from the control circuit 18.

A WL control circuit 28 for the reference word line performs the charging and discharging of the reference word line. To realize this function, the WL control circuit 28 comprises a word-line driver which charges the reference word line and a discharging circuit which discharges the word line.

The output of the BL control circuit 22 is connected to an inverting input terminal of a sense amplifier SA1. The output of the BL control circuit 24 is connected to a non-inverting input terminal of sense amplifier SA1. Sense amplifier SA1 detects the difference between the output of the BL control circuit 22 and that of the BL control circuit 24. The output of sense amplifier SA1 is connected to a determination circuit 29.

The determination circuit 29 determines the output of sense amplifier SA1 after the elapse of a predetermined discharge time from the start of the discharging of the inspection target bit line and the reference bit line. Moreover, the determination circuit 29 holds the output of sense amplifier SA1 as data. Data DO held by the determination circuit 29 is output to the outside through an output buffer 19.

The output of the WL control circuit 26 is connected to an inverting input terminal of a sense amplifier SA2. The output of the WL control circuit 28 is connected to a non-inverting input terminal of sense amplifier SA2. Sense amplifier SA2 detects the difference between the output of the WL control circuit 26 and that of the WL control circuit 28. The output of sense amplifier SA2 is connected to a determination circuit 30.

The determination circuit 30 determines the output of sense amplifier SA2 after the elapse of a predetermined discharge time from the start of the discharging of the inspection target word line and the reference word line. Moreover, the determination circuit 30 holds the output of sense amplifier SA2 as data. The data DO held by the determination circuit 30 is output to the outside through the output buffer 19.

Figure 10:
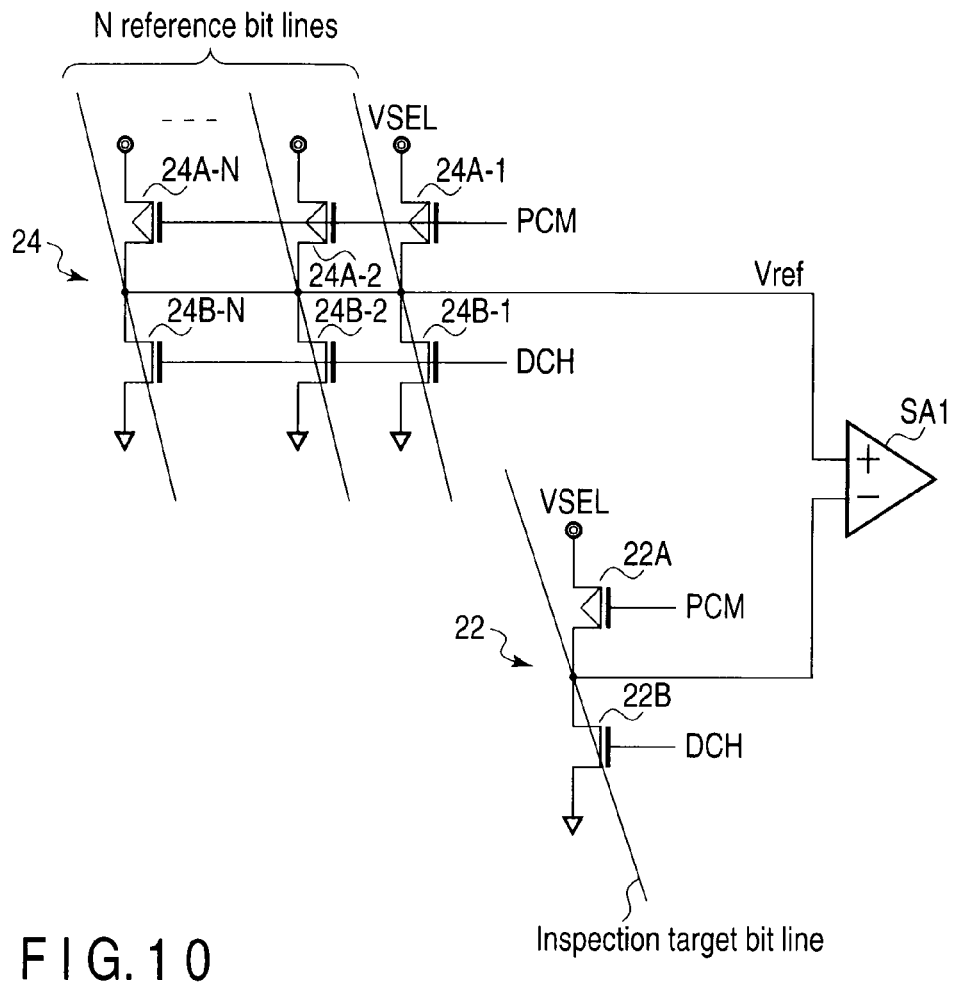
FIG. 10 is a circuit diagram showing a constitution of BL control circuits 22 and 24.

FIG. 10 is a circuit diagram showing constitutions of the BL control circuits 22 and 24. The BL control circuit 22 comprises, for example, a PMOSFET 22A as the bit-line driver which charges the inspection target bit line, and an NMOSFET 22B as the discharging circuit which discharges the inspection target bit line.

The source of PMOSFET 22A is connected to a power source VSEL, a signal PCM which controls the on/off state of PMOSFET 22A is input to the gate of PMOSFET 22A, and the drain of PMOSFET 22A is connected to the inspection target bit line. Signal PCM is made low in a case where the inspection target bit line is charged, and is made high in other cases.

The drain of NMOSFET 22B is connected to the inspection target bit line, a signal DCH which controls the on/off state of NMOSFET 22B is input to the gate of NMOSFET 22B, and the source of NMOSFET 22B is grounded. Signal DCH is made high in a case where the inspection target bit line is discharged, and is made low in other cases.

The BL control circuit 24 comprises, for example, N PMOSFET 24A-1 to 24A-N as the bit-line drivers which charge N reference bit lines and N NMOSFET 24B-1 to 24B-N as the discharging circuits which discharge the N reference bit lines.

The source of each PMOSFET 24A is connected to a power source VSEL, the same signal PCM as that of the BL control circuit 22 is input to the gate of PMOSFET 24A, and the drain of PMOSFET 24A is connected to one reference bit line. The on/off states of the N PMOSFETs 24A-1 to 24A-N are simultaneously controlled by signal PCM.

The drain of each NMOSFET 24B is connected to one reference bit line, the same signal DCH as that of the BL control circuit 22 is input to the gate of NMOSFET 24B, and the source of NMOSFET 24B is grounded. The on/off states of the N NMOSFETs 24B-1 to 24B-N are simultaneously controlled by signal DCH.

Figure 11:
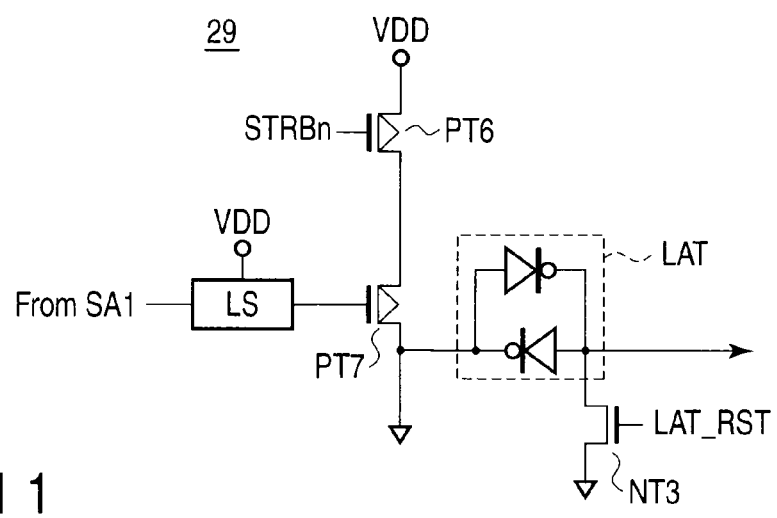
FIG. 11 is a circuit diagram showing a constitution of a determination circuit 29.

FIG. 11 is a circuit diagram showing a constitution of the determination circuit 29. The determination circuit 29 is the same as the rear-stage circuit shown in FIG. 6 of the first embodiment, and hence detailed description thereof is omitted. It is to be noted that the current mirror circuit CM of FIG. 6 may be used as the bit-line drivers (PMOSFETs 22A and 24A) included in the BL control circuits 22 and 24.

In an operation of detecting the open defect of the inspection target bit line, signals PCM and DCH and a signal STRBn are controlled at the same timings as those of FIG. 7. Consequently, after the elapse of a predetermined discharge time from the start of the discharging of the bit lines, the voltage of the inspection target bit line is compared to the reference voltage Vref (i.e., the voltage of the reference bit line).

The constitutions of the WL control circuits 26 and 28 are the same as those of FIG. 10 except that the bit lines change to the word lines. Moreover, the constitution of the determination circuit 30 for the word lines is the same as that of the determination circuit 29 of FIG. 11.

Next, conditions for setting the discharging characteristics of the reference bit line will be described. In the present embodiment, N reference bit lines selected from the plurality of bit lines BL are used to generate the reference voltage Vref to be compared to the voltage of the inspection target bit line. The N reference bit lines are discharged by the N NMOSFETs 24B. That is, the discharging characteristics of the reference bit line vary in accordance with the current driving force of NMOSFET 24B.

FIG. 12A is a diagram showing the extracted inspection target bit line and NMOSFET 22B for discharging, and FIG. 12B is a diagram showing the extracted reference bit line and NMOSFET 24B for the discharging. It is to be noted that drains of the N NMOSFETs 24B-1 to 24B-N shown in FIG. 10 are connected in common to sense amplifier SA1. Therefore, as shown in FIG. 12B, the N NMOSFETs 24B-1 to 24B-N shown in FIG. 10 may be replaced with one NMOSFET 24B having the total of the current driving forces of these transistors. Hereinafter, there will be described the current driving force of NMOSFET 24B (magnitude of drain current) in a case where one NMOSFET 24B is disposed with respect to the N reference bit lines. It is to be noted that the current driving force of the MOSFET is proportional to the gate width (channel width) W, and hence in the present embodiment, the gate width W defines the conditions of the MOSFET.

FIG. 13 is a graph showing the discharging characteristics of the inspection target bit line and the reference bit line. As shown in FIG. 13, when the inspection target bit line is non-defective and when the open defect is present in the inspection target bit line, the discharge time varies in accordance with the difference between the capacitances of these bit lines. The reference voltage Vref needs to be set to a voltage between the voltage of the nondefective bit line and the voltage of the bit line having the open defect (both the voltages are not included).

The gate widths are set to satisfy $W1:W2=1:(N\times\alpha)$, in which W1 is the gate width of NMOSFET 22B and W2 is the gate width of NMOSFET 24B, and $\alpha$ is a numerical value larger than 1, and is, for example, 1.3. In other words, each of the N NMOSFETs 24B-1 to 24B-N has a larger current driving force than NMOSFET 22B. Such conditions are satisfied, whereby also when N reference bit lines are all nondefective, the reference voltage Vref can be set to be lower than the voltage of the nondefective bit line.

Moreover, the ratio of the nondefective bit lines in the N reference bit lines is $\beta$. At this time, the N reference bit lines have a capacitance which is $\beta$ times the total capacitance of the reference bit lines in a case where all the lines are nondefective. In this case, $\alpha$ needs to be set so that the reference voltage Vref is higher than the voltage of the open defect bit line.

Specific Example

Figure 14B:
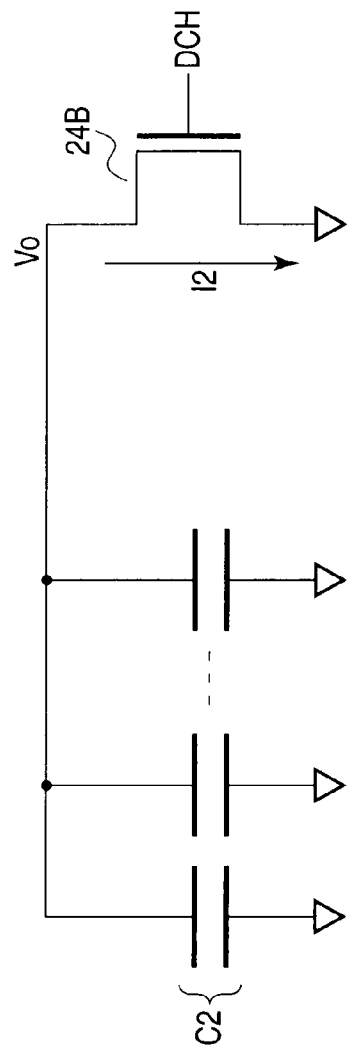
FIGS. 14A and 14B are diagrams for explaining a specific example of a bit-line capacitance.
Figure 14A:
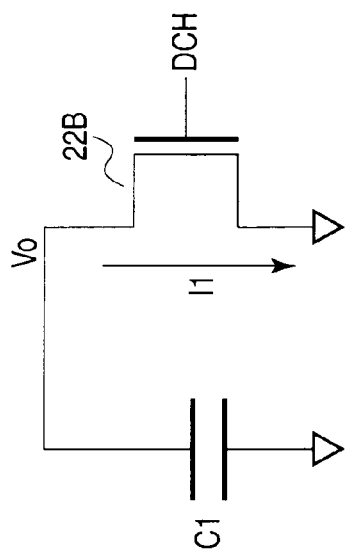

Hereinafter, a specific example of the bit line capacitance will be described. FIG. 14A is a schematic diagram for explaining the capacitance of the inspection target bit line and the discharge current of NMOSFET 22B, and FIG. 14B is a schematic diagram for explaining the capacitance of the reference bit line and the discharge current of NMOSFET 24B.

When the capacitance of the nondefective bit line is $C1=1$ pF and the open defect is present, the capacitance of the nondefective bit line varies in a range of 10 to 70%. There is considered a case where the number of the reference bit lines is 10 and the open defect is generated in three of the reference bit lines. That is, $\beta=0.7$. As to a combined capacitance C2 of the reference bit lines, the maximum value C2 (max) is 10 pF, and the minimum value C2 (min) is 7 pF. It is assumed that the charged voltage is $Vo=5V$ and $\alpha=1.3$. When the inspection target bit line is nondefective, NMOSFET 22B has a discharge current $I1=0.1$ $\mu A$. When all the reference bit lines are nondefective, NMOSFET 24B has a discharge current $I2=1.3$ $\mu A$.

Figure 15:
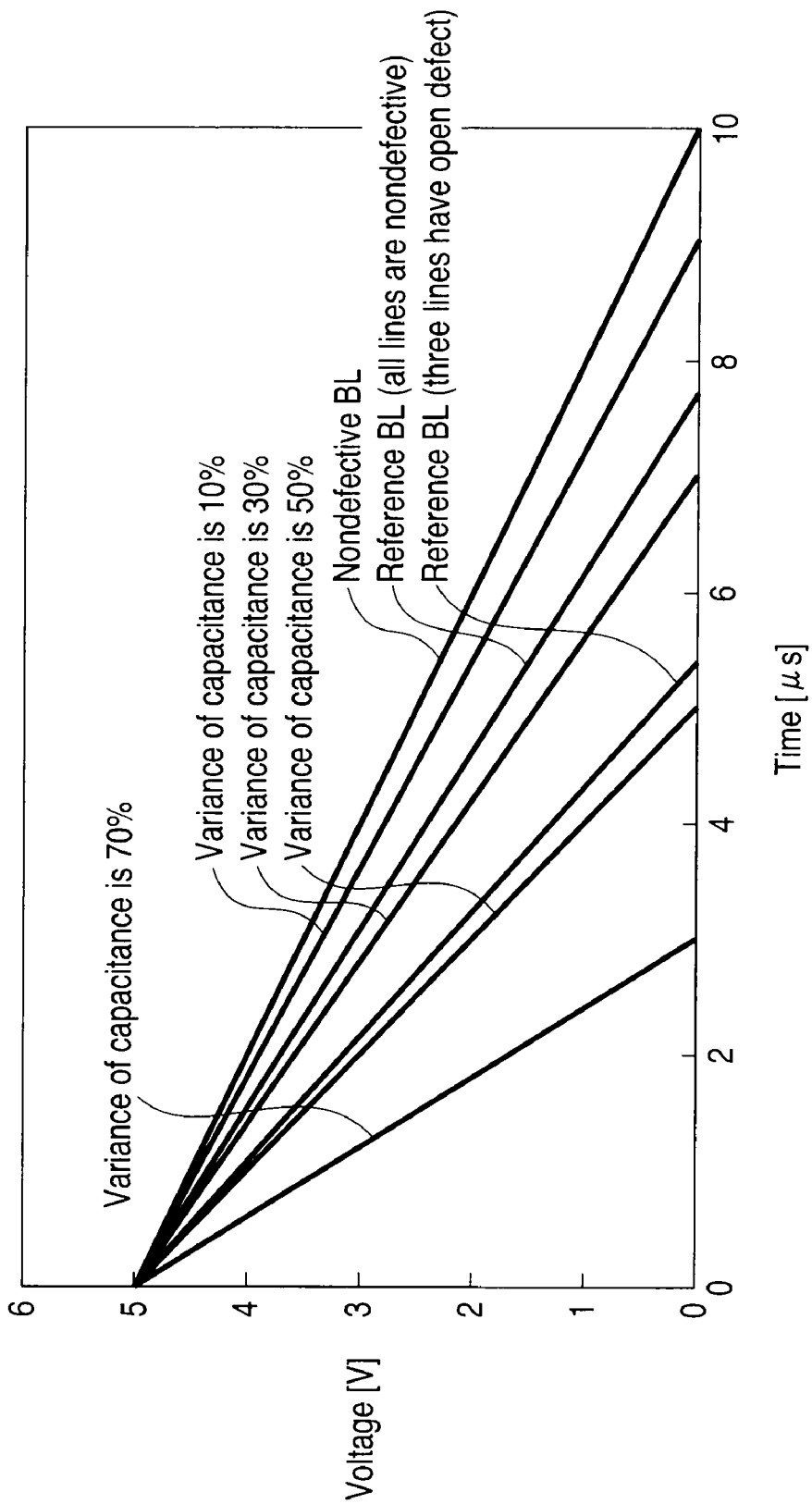
FIG. 15 is a graph showing the discharging characteristics of the inspection target bit line and the reference bit line.

FIG. 15 shows the discharging characteristics of the inspection target bit line and the reference bit line calculated based on such conditions. FIG. 15 shows graphs of the inspection target bit line in cases where (1) the inspection target bit line is nondefective, (2) the variance of the capacitance of the inspection target bit line is 10%, (3) the variance of the capacitance of the inspection target bit line is 30%, (4) the variance of the capacitance of the inspection target bit line is 50% and (5) the variance of the capacitance of the inspection target bit line is 70%. Moreover, FIG. 15 shows graphs of the reference bit line in cases where (1) ten reference bit lines are all nondefective, and (2) three of the ten reference bit lines have the open defect.

As seen from FIG. 15, when the fluctuation range of the capacitance of the reference bit line is taken into consideration, the capacitance of the inspection target bit line having the open defect preferably varies as much as 50% or more from the capacitance of the nondefective inspection target bit line. In this case, the open defect of the inspection target bit line can be detected with a high probability. Even when the capacitance of the reference bit lines having the open defect hardly fluctuates and the capacitance of the inspection target bit line having the open defect varies as much as 30% from the capacitance of the nondefective inspection target bit line, the open defect of the inspection target bit line can be detected. It is to be noted that to guarantee the secure operation of the sense amplifier SA, a potential difference $\Delta V$ may be about 0.3 V.

Moreover, in the case of the approximate calculation of FIG. 15, a time from the start of the discharging to the determination of the open defect (i.e., the timing when signal STRBn goes low) is appropriately from 4 to 5 $\mu s$.

(Inspecting Method)

Figure 16:
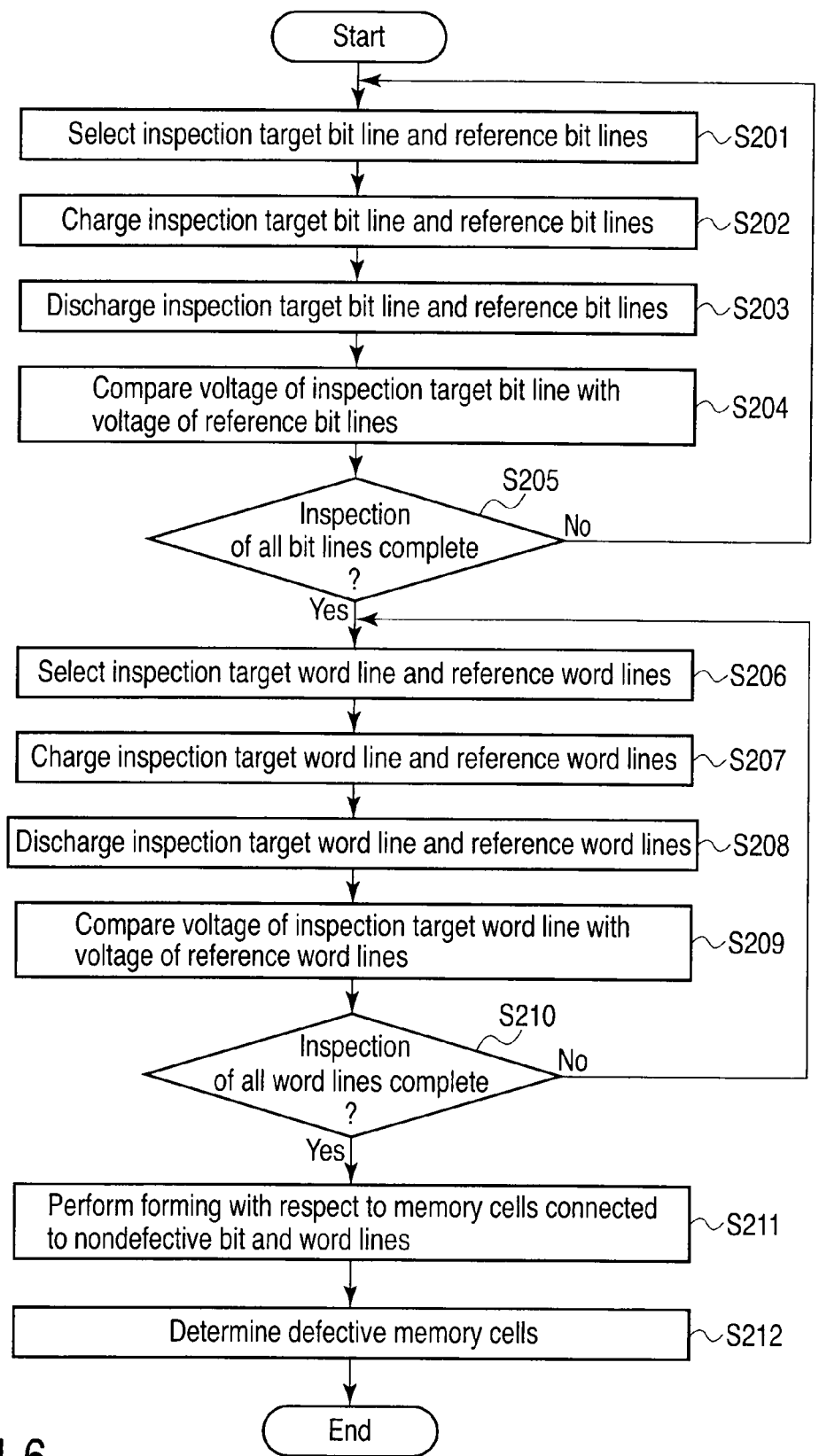
FIG. 16 is a flowchart showing an inspecting method of the resistance-change memory 10.

Next, an inspecting method of the resistance-change memory 10 will be described. FIG. 16 is a flowchart showing the inspecting method of the resistance-change memory 10.

First, the column decoder 21 selects one inspection target bit line, and the column decoder 23 selects N reference bit lines (step S201). Subsequently, the BL control circuit 22 charges the inspection target bit line with a predetermined voltage, and the BL control circuit 24 charges the reference bit line with a predetermined voltage (step S202). Subsequently, the BL control circuit 22 discharges the inspection target bit line, and the BL control circuit 24 discharges the reference bit lines (step S203). Subsequently, after the elapse of a predetermined time from the start of the discharging, sense amplifier SA1 and the determination circuit 29 compare the voltage of the inspection target bit line to the voltage (reference voltage Vref) of the reference bit lines (step S204). Subsequently, the process of steps S201 to S204 is performed with respect to all the bit lines (step S205).

Subsequently, the row decoder 25 selects one inspection target word line, and the row decoder 27 selects N reference word lines (step S206). Subsequently, the WL control circuit 26 charges the inspection target word line with a predetermined voltage, and the WL control circuit 28 charges the reference word lines with a predetermined voltage (step S207). Subsequently, the WL control circuit 26 discharges the inspection target word line, and the WL control circuit 28 discharges the reference word lines (step S208). Subsequently, after the elapse of a predetermined time from the start of the discharging, sense amplifier SA2 and the determination circuit 30 compare the voltage of the inspection target word line to the voltage (reference voltage Vref) of the reference word lines (step S209). Subsequently, the process of steps S206 to S209 is performed with respect to all the word lines (step S210).

At this time, the sorting of lines having the open defect and the nondefective lines has be finished. Therefore, a forming process is performed only with respect to the memory cell connected to the nondefective bit and word lines (step S211). Subsequently, the currents of the memory cells where the forming process has ended are measured to determine defective memory cells (step S212). This determination is also performed only with respect to the memory cells connected to the nondefective bit and word lines.

(Effect)

As described above in detail, in the second embodiment, the reference voltage Vref to be compared to the voltage of the inspection target bit line is generated by using the N reference bit lines selected from the plurality of bit lines BL. Specifically, the charging and discharging of the reference bit lines are performed at the same timings as those of the charging and discharging of the inspection target bit line. Moreover, after the elapse of the predetermined time from the start of the discharging, the voltage of the inspection target bit line is compared to the voltage of the reference bit lines to determine whether the inspection target bit line has the open defect. This also applies to the word lines. Afterward, the forming process is performed only with respect to the memory cells connected to nondefective lines.

Therefore, according to the second embodiment, any current does not flow through the memory cells, but the open defect of the lines can be detected. Consequently, the defect of the lines and the defect of the memory cells can be sorted.

Consequently, the subsequent inspection process can be performed without any waste, and hence manufacturing costs can be decreased.

Moreover, since some of the bit lines are used as the reference bit lines, the reference voltage Vref can easily be generated or a desirable reference voltage Vref can be generated. Moreover, the reference bit lines can arbitrarily be selected by the column decoder 23. Therefore, the bit lines disposed close to the inspection target bit line are selected as the reference bit lines, whereby the accuracy of the reference voltage Vref can be improved.

Moreover, the reference voltage Vref is generated by using the plurality of reference bit lines. Therefore, even when the open defect is generated in some of the plurality of reference bit lines, the reference voltage Vref can securely be generated. Another effect is the same as that of the first embodiment.

Third Embodiment

A third embodiment is provided with a first column decoder which controls odd-numbered bit lines and a second column decoder which controls even-numbered bit lines, and the first and second column decoders select an inspection target bit line and a reference bit line, respectively. Moreover, for example, when the first column decoder selects the inspection target bit line, the second column decoder selects the predetermined number of reference bit lines, and charges and discharges these reference bit lines to generate a reference voltage Vref. This also applies to word lines.

Figure 17:
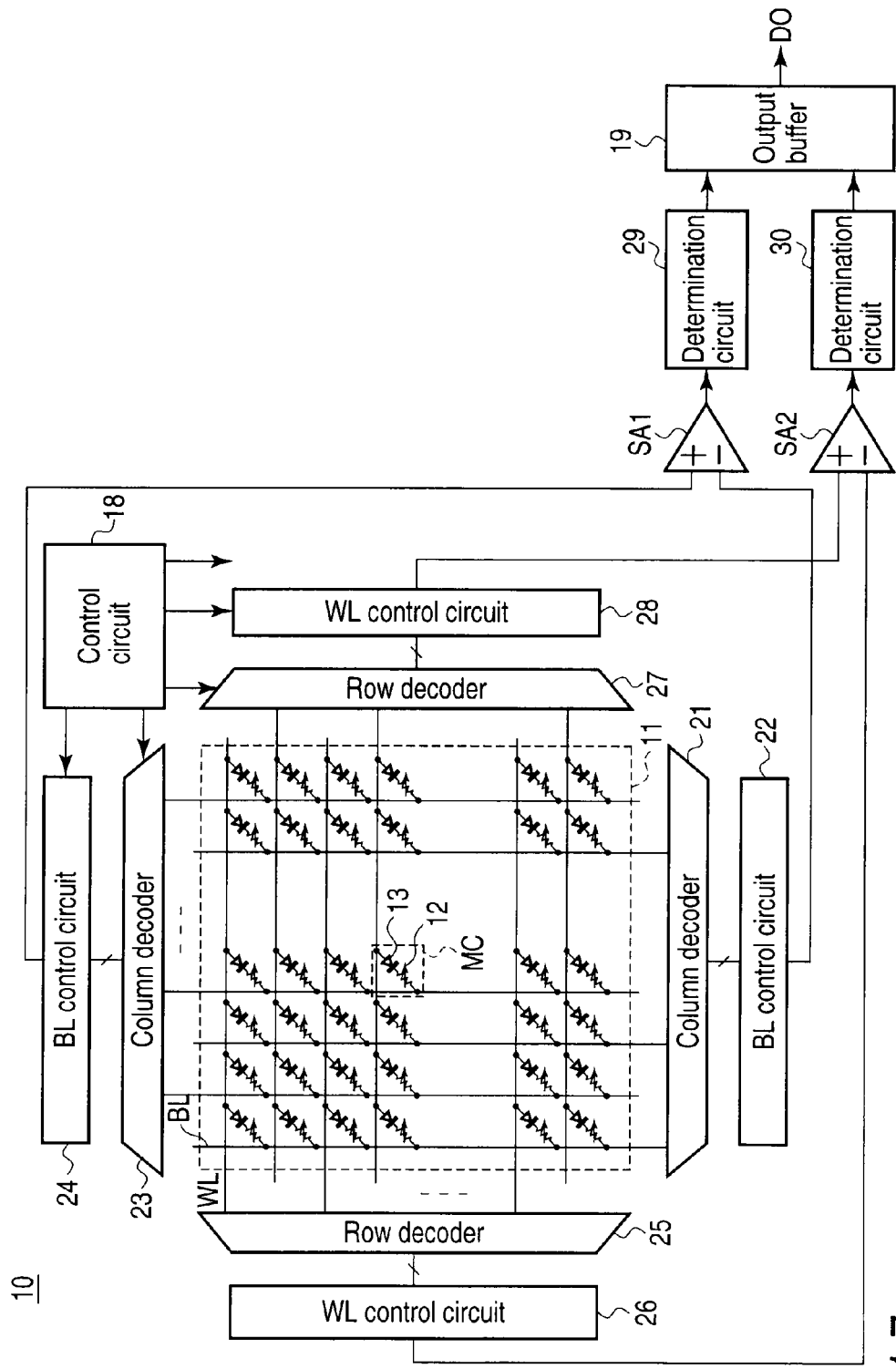
FIG. 17 is a block diagram showing a constitution of a resistance-change memory 10 according to a third embodiment.

FIG. 17 is a block diagram showing a constitution of a resistance-change memory 10 according to a third embodiment.

A column decoder 21 is connected to the odd-numbered bit lines. The column decoder 21 selects one inspection target bit line or N (N is an integer of 1 or more) reference bit lines from the odd-numbered bit lines BL based on, for example, an address sent from a control circuit 18. A column decoder 23 is connected to the even-numbered bit lines. The column decoder 23 selects one inspection target bit line or N reference bit lines from the even-numbered bit lines BL based on, for example, an address sent from the control circuit 18. For example, when the column decoder 21 selects the inspection target bit line, the column decoder 23 selects the reference bit line. On the other hand, when the column decoder 21 selects the reference bit line, the column decoder 23 selects the inspection target bit line.

A BL control circuit 22 performs the charging and discharging of the inspection target bit line or the reference bit lines. To realize this function, the BL control circuit 22 comprises a bit-line driver which charges the inspection target bit line, and a discharging circuit which discharges the inspection target bit line. Moreover, the BL control circuit 22 comprises a bit-line driver which charges the reference bit lines, and a discharging circuit which discharges the reference bit lines. The constitutions of the driver and discharging circuit for the inspection target and the constitutions of the driver and discharging circuit for a reference are the same as those of FIG. 10. The driver and discharging circuit for the inspection target and the driver and discharging circuit for the reference are selectively used in accordance with an instruction of the control circuit 18. A constitution of a BL control circuit 24 is the same as that of the BL control circuit 22.

Also in the case of such a constitution, an effect similar to that of the second embodiment can be obtained. Moreover, the bit lines disposed close to the inspection target bit line are used as the reference, whereby the accuracy of a reference voltage Vref can be improved. It is to be noted that the polarity of a sense amplifier SA1 changes depending on whether the inspection target bit line is even numbered or odd numbered, but this can be regulated, for example, by changing the polarity of a determination circuit 29 when the inspection target bit line is even numbered.

Moreover, a row decoder 25 is connected to odd-numbered word lines. A row decoder 27 is connected to even-numbered word lines. Constitutions and operations of the row decoders 25 and 27 and WL control circuits 26 and 28 are also the same as those in an example of the bit lines.

It is to be noted that in the above embodiments, the resistance-change memory has been described as an example, but the present embodiments are not limited to the resistance-change memory, and the present embodiments can be applied to any type of semiconductor memory device as long as the device has a constitution including memory cells and lines connected to the cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array comprising memory cells;
lines provided to correspond to the memory cells;
a first decoder configured to select a first line as an inspection target from the lines;
a second decoder configured to select a second line for generating a reference voltage from the lines; a driver configured to charge the first and second lines;
a discharging circuit configured to simultaneously discharge the first and second lines; and
a sense amplifier configured to compare a voltage of the first line to a voltage of the second line to detect a defect of the first line while the first line is discharged.

2. The device of claim 1, wherein
the discharging circuit includes a first discharging circuit which discharges the first line and a second discharging circuit which discharges the second line, and
the second discharging circuit has a larger current driving force than the first discharging circuit.

3. The device of claim 1, wherein the second decoder selects N (N is an integer of 2 or more) second lines.

4. The device of claim 3, wherein
the discharging circuit includes a first discharging circuit which discharges the first line and a second discharging circuit which discharges the second line, and
the second discharging circuit has a current driving force satisfying N×A×α (α is larger than 1), in which A is a current driving force of the first discharging circuit.

5. The device of claim 1, further comprising a determination circuit configured to receive an output of the sense amplifier, and to determine the defect of the first line.

6. The device of claim 1, wherein each of the memory cells includes a variable resistance element and a selection element connected in series.

7. The device of claim 6, wherein the variable resistance element includes first and second electrodes and a resistance-change film sandwiched between the first electrode and the second electrode.

8. The device of claim 1, wherein the memory cell array has a three-dimensional structure in which the memory cells are arranged horizontally and vertically.

9. A semiconductor memory device comprising:
a memory cell array comprising memory cells;
lines provided to correspond to the memory cells;
a decoder configured to select a first line as an inspection target from the lines;
a driver configured to charge the first line;
a discharging circuit configured to discharge the first line; and
a sense amplifier configured to compare a voltage of the first line to a reference voltage to detect an open circuit of the first line while the first line is discharged.

10. The device of claim 9, wherein the reference voltage is set to a voltage between a discharge voltage of a line having an open circuit and a discharge voltage of a line which does not have any open circuit during the comparison by the sense amplifier.

11. The device of claim 9, further comprising a determination circuit configured to receive an output of the sense amplifier, and to determine the open circuit of the first line.

12. The device of claim 9, wherein each of the memory cells includes a variable resistance element and a selection element connected in series.

13. The device of claim 12, wherein the variable resistance element includes first and second electrodes and a resistance-change film sandwiched between the first electrode and the second electrode.

14. The device of claim 9, wherein the memory cell array has a three-dimensional structure in which the memory cells are arranged horizontally and vertically.

15. An inspecting method of a semiconductor memory device comprising memory cells and lines provided to correspond to the memory cells, the method comprising:
selecting a first line as an inspection target from the lines;
charging the first line;
discharging the first line;
comparing a voltage of the first line to a reference voltage while the first line is discharged;
determining whether the first line has an open circuit, based on the result of the comparison; and
activating a memory cell connected to the first line when the first line is not an open circuit.

16. The method of claim 15, wherein each of the memory cells includes a variable resistance element and a selection element connected in series.

17. The method of claim 16, wherein the variable resistance element includes first and second electrodes and a resistance-change film sandwiched between the first electrode and the second electrode.

18. The device of claim 15, wherein the memory cell array has a three-dimensional structure in which the memory cells are arranged horizontally and vertically.

* * * * *